United States Patent
Erington et al.

(10) Patent No.: US 7,973,545 B2
(45) Date of Patent: Jul. 5, 2011

(54) TIME RESOLVED RADIATION ASSISTED DEVICE ALTERATION

(75) Inventors: Kent B. Erington, Austin, TX (US); John E. Asquith, Autin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 466 days.

(21) Appl. No.: 12/107,398

(22) Filed: Apr. 22, 2008

(65) Prior Publication Data

US 2009/0261840 A1 Oct. 22, 2009

(51) Int. Cl.
*G01R 31/307* (2006.01)
*G01R 31/3183* (2006.01)

(52) U.S. Cl. ..................................... 324/752
(58) Field of Classification Search ................ None
See application file for complete search history.

(56) References Cited

U.S. PATENT DOCUMENTS

| | | | |
|---|---|---|---|
| 4,786,865 A | 11/1988 | Arimura et al. | |
| 6,078,183 A | 6/2000 | Cole, Jr. | |
| 6,169,408 B1 * | 1/2001 | Kantor et al. | 324/752 |
| 6,549,022 B1 | 4/2003 | Cole, Jr. et al. | |
| 6,840,666 B2 * | 1/2005 | Enachescu et al. | 374/5 |
| 6,967,491 B2 | 11/2005 | Perdu et al. | |
| 7,038,474 B2 | 5/2006 | McGinnis et al. | |
| 7,446,550 B2 * | 11/2008 | McDowell et al. | 324/763 |
| 2002/0011852 A1 * | 1/2002 | Mandelis et al. | 324/752 |

OTHER PUBLICATIONS

Rowlette, Jeremy et al. "Critical Timing Analysis in Microprocessors Using Near-IR Laser Assisted Device Alteration (LADA)." ITC International Test Conference. Paper 10.4. pp. 264-273. Copyright 2003 IEEE.
Bodoh, Dan et al. "Diagnostic Fault Simulation for the Failure Analyst." Freescale Semiconductor, Austin, TX. pp. 1-10. 2004.

* cited by examiner

*Primary Examiner* — Paresh Patel
(74) *Attorney, Agent, or Firm* — Gary R. Stanford

(57) ABSTRACT

A method of time resolved radiation assisted device alteration testing of a semiconductor circuit which includes performing spatially resolved radiation assisted circuit testing on the semiconductor circuit while applying a test pattern to determine a pass-fail modulation location, asynchronously scanning the semiconductor circuit with radiation while repeatedly applying the test pattern and providing pass-fail results, combining corresponding pass-fail results provided during the asynchronously scanning to determine a shifted pass-fail modulation indication, determining time shift information between the pass-fail modulation location and the shifted pass-fail modulation indication, and identifying at least one of the test vectors based on the time shift information. The radiation may be a continuous wave laser beam. The time shift information may be determined by scanning an image, incorporating graphics into the image indicating the pass-fail modulation location and the shifted pass-fail modulation indication, and measuring a pixel shift on the scanned image.

20 Claims, 4 Drawing Sheets

TIME RESOLVED RADIATION ASSISTED DEVICE ALTERATION

BACKGROUND OF THE INVENTION

1. Field of the Invention

The present invention relates in general to identifying sensitive or performance limiting areas or suspect locations of semiconductor devices, and more specifically to a time resolved radiation assisted device alteration technique for determining timing information relative to a test pattern of suspect locations of a device under test using asynchronously scanned radiation stimulation such as a laser.

2. Description of the Related Art

A variety of radiation-based stimulation circuit testing techniques are known for failure or performance analysis of semiconductor devices. Radiation stimulation involves the use of various forms of radiation or emissions or the like with sufficient energy to modify operating behavior of semiconductor circuitry for the purpose of identifying potential problem areas of a semiconductor device. These problem areas are "suspect locations" which includes performance limiting areas or defective circuits and the like. Although many types of radiation may be used, it is desired that the radiation convey sufficient energy to modify circuit operation for purposes of testing the limits of circuit operation. A laser beam, for example, is capable of conveying a significant level of power without damaging semiconductor circuitry and thus is often the radiation of choice for testing. The circuit modification may be any one or more of multiple types, such as modified timing of a device (e.g., transistor, gate, node, etc.), modified voltage level, modified current level, modified resistance, etc. A timing adjustment may reveal, for example, a race condition between two or more circuit paths thereby limiting maximum frequency of operation of the semiconductor device. Similarly, a marginal voltage or current or resistance level affecting pass-fail behavior may be revealed using radiation perturbation during testing. It is appreciated that many other measurable variations of a device may be monitored for determining pass-fail behavior, such as an input/output (I/O) voltage level or timing, VDD or pin current, output frequency, a signal slew rate, etc.

Laser assisted device alteration (LADA) is a known laser scan technique used in the failure analysis of semiconductor devices. A laser generated by a laser scanning microscope (LSM) or the like is used to alter the operating characteristics of transistors, metal interconnects or other components on the semiconductor device under test (DUT) while it is electrically stimulated. Certain operating characteristics of the laser (e.g., wavelength, laser spot size, power, etc.) may be selected or otherwise adjusted to modify circuit characteristics, such as circuit timing. For example, a laser operating at a wavelength of approximately 1,064 nanometers (nm) produces localized photocurrents within active transistor layers in which the photo-generated currents modify circuit timing. Alternatively, a laser operating at a wavelength of approximately 1,340 nm produces localized heating which also alters circuit timing (e.g., slowing down of logic transitions). It has been observed that photocurrent injection enables significantly larger timing shifts as compared to thermally induced alteration, so that photocurrent injection is more commonly used for "standard" LADA testing. Electrical stimulation of the DUT is usually performed by automated test equipment (ATE) which applies an ATE test loop or test pattern to the DUT and monitors the results. The term "ATE" as used herein refers to any test equipment or electronic device or system or the like which provides electrical stimulation to a DUT and which monitors results. The test pattern is designed by test engineers with multiple test vectors applied in sequential order to perform critical timing testing.

According to an exemplary LADA test technique, the entire area or a selected portion of interest of the DUT is first scanned by the laser at an appropriate imaging power and the reflected image is monitored and mapped to provide a visual image of the topology of the physical circuit. The power of the laser is adjusted to an appropriate level for analysis and applied to the same mapped area of DUT while the test procedure is conducted by the ATE. In particular, the test pattern is applied at a selected clock rate and the results are monitored while the laser is applied to one pixel location of the mapped area. The laser is moved (e.g., slow scan or discrete positioning) relative to the DUT to the next pixel and the entire test pattern is repeated. It is appreciated that the laser beam or the DUT may be moved for laser scanning depending upon the laser equipment as understood by those skilled in the art. One or more test variables, such as laser power, supply voltages, temperature, clock frequency, etc., may also be selected to adjust operation relative to a pass-fail boundary of the voltage-frequency relationship (which may be plotted on a "shmoo" graph to illustrate the pass-fail boundary as known to those skilled in the art). In a pass test mode, the variables are selected to adjust timing towards a pass-fail threshold while still in the pass area and the test pattern is applied to determine any fail locations. In a fail test mode, the variables are selected to adjust timing just beyond the pass-fail threshold into the fail area and the test pattern is applied to determine any pass locations. In a pass-fail test mode, the variables are selected to adjust timing on the pass-fail boundary and the test pattern is applied multiple times for each pixel location. The statistics are measured to identify any suspect locations that deviate from the expected test results by a statistically significant or measurable amount. It is noted that "significant" deviations may include subtle or minor deviations determined by averaging a large number values or the like. In a 50/50 pass-fail test in which results of multiple tests are averaged, any locations that deviate from the expected 50% pass-fail rate are identified for additional testing. For example, locations which pass or fail more or less than 50% are considered suspect locations. The LADA analysis has been used in this manner to identify circuit nodes or elements that modulate the pass-fail result.

The next step in the device analysis is signal acquisition, such as, for example, time resolved light emission microscopy (TRLEM) probing. Signal acquisition techniques other than TRLEM probing are known and contemplated. During TRLEM probing, suspect nodes are probed during the test pattern in an attempt to identify the deviation from expected results. The TRLEM technique is used to acquire functional waveforms from the substrate in a contactless manner through the back of the die. For example, infrared light is used since silicon is transparent to this wavelength so that infrared light escapes through the back of the die. The light versus time waveform is a function of the device current, device voltage, device temperature, etc. through the transistor or component being probed. Thus, the current through a device is indirectly measured to identify when it switches and the voltage and logic levels versus time can be determined from other more subtle characteristics of the light versus time signal. TRLEM is analogous to an oscilloscope and other probing techniques.

The conventional LADA test procedure is predominately empirical in nature since although the suspect location is determined, the timing information is not provided. More specifically, the particular test vector which caused the test deviation during laser excitation at each suspect location is not known. The pass-fail indication is not provided on a vector by vector basis but instead is only provided at the end of each test pattern. The test pattern generally includes hundreds or thousands (or more) of test vectors, so that selection of timing is a time-consuming trial and error approach. The TRLEM procedure without timing information often consumes a significant amount of analysis time with a relatively low success rate (e.g., success rate is estimated to be less than 1 percent). Probe selection is particularly difficult since only one probe point is monitored at a time over a very small window of time relative to the overall duration of the test pattern. As an example, a typical test pattern may have a duration of approximately 20,000 clock cycles (at 1 test vector per clock cycle) and the probe window is only about 20 clock cycles, such that the test pattern duration is one thousand times the size of the probe window.

If nothing unusual or helpful is discovered during the initial TRLEM probing, then backwards TRLEM probing is conducted starting from the external input/output (I/O) pad of the die that indicated the failure. In some cases, this analysis path is made even more difficult as in the case where a built-in self test (BIST) pattern fails and there is no way to accurately predict where in the pattern the statistical deviation event occurred. The loop length can be more than 1,000 times longer than the functional probing time window. This portion of testing, if necessary, consumes a substantial amount of valuable analysis time (e.g., several days or weeks).

At least one method is known for determining spatial and temporal selective laser assisted fault localization. This method requires a pulse laser system with a fully controllable dynamic laser stimulation apparatus connected to a control unit that provides complete synchronization with a tester unit. Synchronized pulse laser systems, however, are not readily available, can be very expensive, and are challenging to integrate into an existing LSM system. The synchronized pulse laser technique requires synchronization between the test pattern and laser pulses which is very complex and difficult to achieve. Thus, the synchronized pulse laser technique has not been widely used.

BRIEF DESCRIPTION OF THE DRAWINGS

The benefits, features, and advantages of the present invention will become better understood with regard to the following description, and accompanying drawings where.

DETAILED DESCRIPTION

The following description is presented to enable one of ordinary skill in the art to make and use the present invention as provided within the context of a particular application and its requirements. Various modifications to the preferred embodiment will, however, be apparent to one skilled in the art, and the general principles defined herein may be applied to other embodiments. Therefore, the present invention is not intended to be limited to the particular embodiments shown and described herein, but is to be accorded the widest scope consistent with the principles and novel features herein disclosed.

Figure 1:
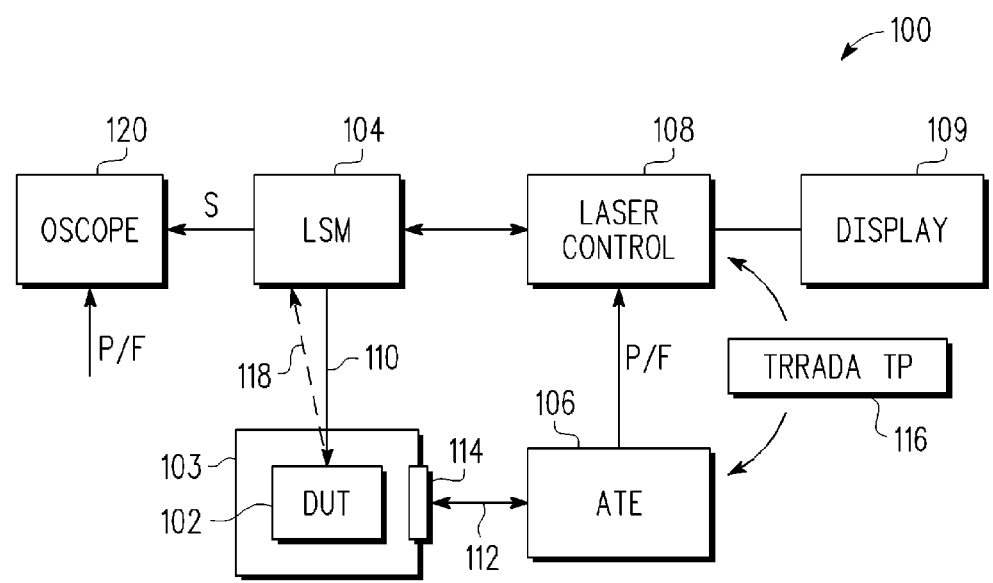
FIG. 1 is a simplified block diagram of a time resolved laser assisted device alteration (TRLADA) test system implemented according to an exemplary embodiment for testing a semiconductor device under test (DUT)

FIG. 1 is a simplified block diagram of a time resolved laser assisted device alteration (TRLADA) test system 100 implemented according to an exemplary embodiment for testing a semiconductor device under test (DUT) 102. The TRLADA test system 100 is implemented according to one embodiment of the time resolved radiation assisted device alteration described herein, in which TRLADA employs a laser beam to perturb circuit operation. It is understood that alternative embodiments using radiation types other than laser are contemplated. The TRLADA test system 100 includes a laser scanning microscope (LSM) 104, automated test equipment (ATE) 106, a laser control unit 108, and a display device 109. The DUT 102 is installed or mounted onto a suitable fixture 103 which is installed on the LSM 104 to be exposed to a laser beam 110 from the LSM 104 for purposes of testing the DUT 102 as described herein. An input/output (I/O) cable 112 (or multiple conductors or sensors or the like) is coupled between the ATE 106 and an I/O interface 114 (e.g., connector) of the fixture 103. As appreciated by those skilled in the art, the fixture 103 couples each pin or node of interest of the DUT 102 to the I/O interface 114 when mounted onto the fixture 103 for purposes of testing. Each input and output of the interface 114 is routed via the cable 112 for access and control by the ATE 106. The laser control unit 108 is coupled via the appropriate interfaces to receive a pass-fail (P/F) signal from the ATE 106 and to control the LSM 104 for controlling laser scanning and for receiving test results. In one embodiment the LSM 104 is a non-pulsed continuous wave (CW) laser system, such as, for example, the Zeiss LSM 310 manufactured by Carl Zeiss, Inc. The ATE 106 is configured to program any initial conditions or states of the DUT 102 and to provide one or more selected test patterns appropriate for the DUT 102 and to monitor and store test results. The ATE 106 may further be configured to adjust any one or more of selected operating conditions or parameters, such as voltage supply levels, clock frequency, temperature, etc. The laser control unit 108 is configured in any suitable manner for controlling the LSM 104 and to receive the P/F signal from the ATE 106 indicating test results while testing the DUT 102. A display device 109 is coupled to the laser control unit 108 for purposes of displaying test results.

The laser control unit 108 and the ATE 106 are both controlled or otherwise operated according to a time resolved radiation assisted device alteration (TRRADA) test procedure (TP) 116 implemented according to one embodiment. Although the LSM 104 and the ATE 106 may be controlled by a common or central controller or the like (not shown), the ATE 106 usually incorporates a separate control interface. In one embodiment, the laser control unit 108 is configured as a personal computer (PC) or the like having a video monitor implementing the display device 109. The computer system implementing the laser control unit 108 may include any combination of software, firmware or hardware for controlling the LSM 104, receiving test results from the ATE 106 via the P/F signal, and displaying test results on the display device 109. In one embodiment, the computer system includes an interface card or the like for controlling the LSM 104 and interfacing the ATE 106 as appreciated by those skilled in the art. The LSM 104, the laser control unit 108 and the display device 109 are shown as separate components, but may be integrated into a single laser system. As described further below, the LSM 104 scans an area of interest (entire circuit area of DUT 102 or a selected portion thereof) at an imaging power level in which a laser beam reflection 118 is reflected back to the LSM 104 to capture a reflected image. The reflected image is provided to the laser control unit 108 for storage and/or display on the display device 109. The LSM 104 and the ATE 106 are then controlled to perform laser assisted device alteration (LADA) testing to identify any suspect locations, and the test results from the ATE 106 are forwarded to the laser control unit 108 via the P/F signal. LADA testing has become a conventional laser-based testing method for resolving suspect location information, where it is understood that any spatially resolved radiation assisted circuit testing method may be used rather than the "standard" LADA test. The LSM 104 and the ATE 106 are then controlled according to the TRRADA test procedure 116 to perform an "asynchronous laser scan" or asynchronous laser scan test procedure and the test results from the ATE 106 are forwarded to the laser control unit 108. The asynchronous laser scan test procedure incorporates timing information in which laser assisted test results are shifted in position relative to the identified suspect locations. The LADA test results are compared with the asynchronous laser scan test procedure results to determine the particular test vector (or vectors) causing the failure or other pass-fail modulation at each suspect location. Functional analysis may then be initiated by TRLEM probing each suspect location at the test vector determined to cause the pass-fail modulation.

Figure 2:
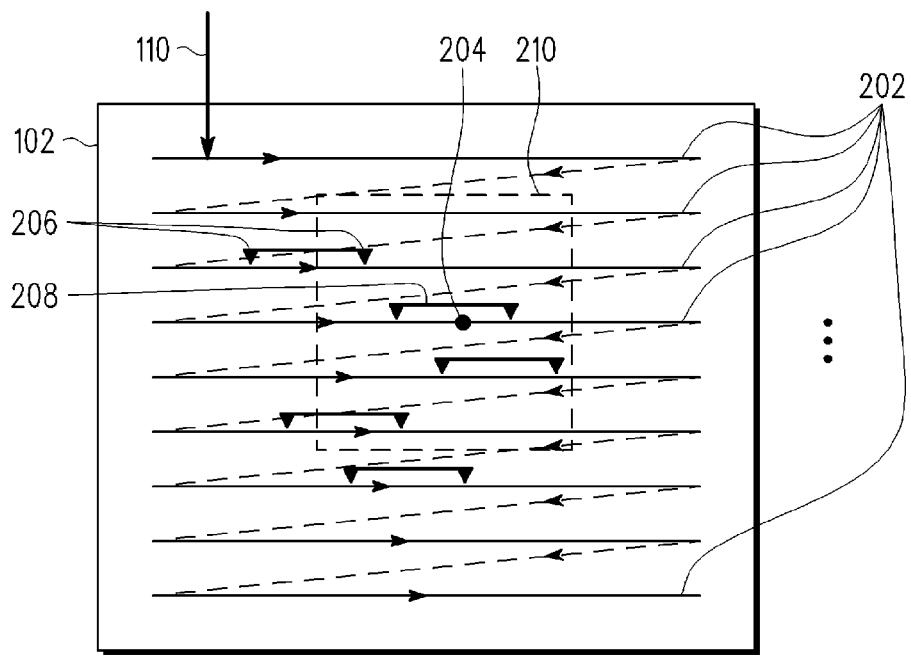
FIG. 2 is a simplified diagram of the scanned area of the DUT of FIG. 1 illustrating the asynchronous laser scan test procedure according to one embodiment.

FIG. 2 is a simplified diagram of the scanned area of the DUT 102 illustrating the asynchronous laser scan test procedure according to one embodiment. Horizontal lines 202 are drawn across the area of the DUT 102 depicting scan lines of the laser beam 110 during the test procedure. Dotted diagonal lines shown between the horizontal lines depict the return of the laser beam 110 from one horizontal line 202 to the next. In one embodiment, the laser beam 110 scans the DUT 102 from top to bottom following each horizontal line 202 from left to right. After scanning each horizontal line 202 from left to right, the laser beam 110 returns to the next lower horizontal line 202 and repeats from top to bottom of the DUT 102 until the area of interest is scanned, and then returns back to the top line similar to the sequential scanning technique of a video monitor or television. Although not explicitly shown, each horizontal line 202 includes a row of picture element (pixel) locations in which the number of pixel locations defines the scan resolution. In one embodiment, 512 horizontal lines 202 are included in which each horizontal line 202 includes 512 pixels, although other resolutions are contemplated. The DUT 102 is first scanned using an imaging power level laser beam and the reflected beam 118 is captured by the LSM 104 and mapped to provide a scanned image of the DUT 102. The LADA or other spatially resolved radiation assisted circuit testing is then performed in which an entire "ATE test loop" or test pattern 402 (FIG. 4) is performed while the laser beam 110 perturbs the DUT 102 circuitry corresponding to one pixel location, and the process is repeated for each pixel location within the area of interest. In particular, the ATE 106 applies the test pattern 402 while the LSM 104 focuses the laser beam 110 on one pixel location of the DUT 102, and this procedure is repeated for the next sequential pixel in the laser scan pattern and so on in a pixel-by-pixel manner for each pixel location of each horizontal line 202 within the area of interest.

The test results are provided from the ATE 106 in the form of a P/F indication via the P/F signal to the laser control unit 108. The laser beam perturbs the circuit and modifies device characteristics thereby changing circuit operation (e.g., signal timing, voltage levels, etc.) during application of the test pattern. Those locations in which circuit operation is sufficiently modified to cause significant deviations from expected pass-fail behavior of the DUT are considered "suspect locations" otherwise referred to herein as P/F modulation locations. The P/F modulation locations or suspect locations are those areas of the circuitry areas which are defective or otherwise which limit performance in some manner. These P/F modulation locations are identified for further investigation to isolate or determine critical path problems or performance limiting transistors, gates, or other circuit elements. A P/F modulation location 204, illustrated by a dot symbol, depicts a pass-fail modulation site of the DUT 102 during the test pattern 402 when the laser beam 110 was applied to the P/F modulation location 204. The P/F modulation location 204 is identified as a "suspect location" to be analyzed during functional testing in an attempt to identify the reason for the deviation from expected pass-fail results. As evident to those skilled in the art, the spatially resolved radiation assisted circuit testing provides spatial information without providing timing information. In particular, spatially resolved radiation assisted circuit testing, such as LADA, only determines one or more P/F modulation locations on the DUT 102. The timing information, specifically, which test vector of the test pattern 402 caused the P/F modulation, is not provided. The timing information is very useful for identifying the particular conditions which caused the P/F modulation.

Figure 3:
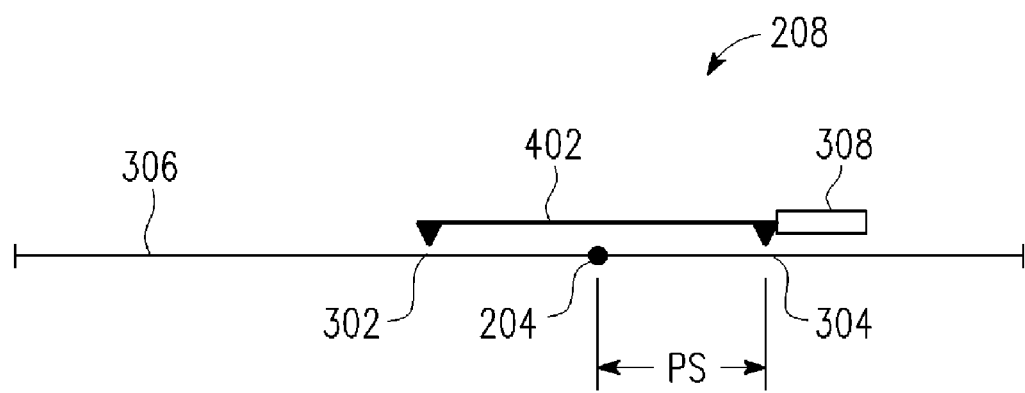
FIG. 3 is a diagram depicting the test pattern scan during the asynchronous laser scan test procedure of FIG. 2 in which the test pattern occurs between start and stop locations along a horizontal scan line overlapping a pass-fail modulation location of the DUT.

The LSM 104 is then operated while the P/F signal from the ATE 106 is monitored to perform an asynchronous laser scan test procedure according to the TRRADA test procedure 116 as depicted in FIG. 2. The asynchronous laser scan test procedure is similar to the LADA testing procedure except that the LSM 104 scans across multiple pixel locations for each test pattern 402 rather than staying on one pixel location per test pattern iteration. The selected scan rate may be based on several factors, such as the number of test vectors in the test pattern and a test vector rate, and the scan rate may be adjusted depending upon test results. As shown, the starting and stopping locations 206 of the test pattern 402 are depicted by triangular-shaped symbols while the laser beam 110 scans the DUT 102, where each laser scan from start to stop is referred to as a test pattern scan. The laser beam scanning is performed repeatedly from top to bottom and from left to right across the DUT 102 similar to multiple frames of a video monitor. The test pattern 402 is repeated continuously during the laser beam scanning yet asynchronously with respect to the laser beam scanning so that the test pattern scans are distributed within the area of interest of the DUT 102. The P/F signal at the end of each test pattern scan is incorporated into a test result database or scan image. In one embodiment, an image is generated or otherwise updated with each P/F result in which a brighter pixel is used to illustrate passing results and a darker pixel is used to illustrate failing results relative to a grayscale. For example, the P/F signal indicating a test result (i.e., P/F output) is converted to a corresponding image value (using different colors, shadings, illuminations, etc.)

and incorporated within a display image. In one embodiment, each P/F output is averaged over time and over multiple image frames. Eventually, at least one test pattern scan, such as, for example, test pattern scan 208, aligns with the P/F modulation location 204 resulting in a shifted P/F modulation indication 308 (FIG. 3). The P/F modulation indication 308 is provided at the end of the test pattern 208 so that the P/F modulation indication 308 is shifted in position relative to the P/F modulation location 204 as further described below. Since the P/F modulation location 204, the laser scan rate, the vector number in which the P/F signal is generated, the timing of each test vector and the pixel shift are known or otherwise determined, the test vector coincident with the P/F modulation location 204 can be calculated or otherwise estimated with relative accuracy.

A smaller scan window 210 illustrates an alternative embodiment in which the asynchronous laser scan test procedure is performed within the smaller scan window 210 rather than the entire area of interest of the DUT 102. The scan window 210 is a smaller portion of the area of interest which is centered around or which otherwise incorporates the P/F modulation location 204. The asynchronous laser scan test procedure performed within the scan window 210 is very similar to scanning within the entire area. In one embodiment, the scan rate and resolution may be modified for the scan window 210 to reduce overall scan time and to potentially improve accuracy of estimation of the test vector number at which P/F modulation occurred.

The length the test pattern scans may be adjusted during the asynchronous laser scan test procedure, such as by adjusting the scan speed of the laser beam 110. Shorter test pattern scans may provide faster results but with less accuracy. Longer test pattern scans provide more accurate results up to a point. For example, longer test pattern scans may be less likely to result in a failure indication. In the illustrated embodiment the comparison analysis is performed using images displayed on the display device 109. In an alternative embodiment, a laser scanning synchronization signal S from the LSM 104 is provided to an oscilloscope (OSCOPE) 120 as a trigger mechanism while averaging values of the P/F signal from the ATE 106 on the oscilloscope 120. In this alternative embodiment the laser is scanned in a line mode scan across each critical circuit location so that each laser scan is across the same line of pixels. The oscilloscope 120 displays the P/F signal values along a time axis relative to the synchronization signal S to provide a direct time domain measurement. In one embodiment, the LSM 104 is limited in the amount of P/F result information which is averaged per pixel, such as a limit of 256 P/F data values per pixel, whereas the oscilloscope 120 is capable of averaging a significantly greater number of values per pixel, such as 1,000 or 10,000 values per pixel or more. Thus, the oscilloscope 120 averages a significantly greater amount of information allowing for significantly longer test patterns and/or slower laser scan rates to achieve more accurate timing information. It is appreciated that the oscilloscope 120 may be replaced with other time-based or frequency-based equipment.

FIG. 3 is a diagram depicting the test pattern scan 208 during the asynchronous laser scan test procedure in which the test pattern 402 begins at a start location 302 and ends at a stop location 304 along a horizontal scan line 306 overlapping the P/F modulation location 204 of the DUT 102. The test vector of the test pattern 402 which caused the PF modulation indication occurs when the laser beam strikes the P/F modulation location 204 causing the corresponding shifted P/F modulation indication 308 at the end of the test pattern scan 208. In one embodiment the P/F modulation indication 308 is indicated by a different color or shading relative to the background scanned image. Although the P/F modulation indication 308 is represented as spanning multiple pixel locations as a result of faster laser scanning, the length (or duration) of the P/F modulation indication 308 is arbitrary and may be adjusted to any length or duration. In any event, the P/F modulation indication 308 begins immediately after the end of the test pattern scan 208. The horizontal shift between the P/F modulation location 204 and the stop location 304, which may also be referred to as a "time shift" or "x shift", is measured as a pixel shift (PS) in the illustrated embodiment. The pixel shift PS is measured as the number of pixels between the P/F modulation location 204 and the stop location 304. This measurement may be made manually (visual inspection and measurement) or by using any appropriate scanning technique. It is noted that the PS measurement may not be an exact measurement but is nonetheless a relatively accurate method of estimating the timing of the test vector causing the failure. In an alternative embodiment, the oscilloscope 120 enables a longer pixel shift measurement or direct measurement of time shift for more accurate results.

The scan rate SR of the laser beam 110 is adjusted and may be represented as a number of pixels per second. The pixel rate PR, which is the amount of time per pixel, is the inverse of the scan rate or PR=1/SR (in which a forward slash "/" denotes division). The time shift (TS) from the time of failure at the P/F modulation location 204 to the stop location 304 is calculated as TS=PS*PR (in which an asterisk "*" denotes multiplication). Also, the total test time TT is divided by the total number of test vectors (TV) of the test pattern 402 to determine the vector time (VT) or time for each vector, or VT=TT/TV. The vector shift (VS), which is the number of test vectors applied to the DUT 102 from the P/F modulation location 204 to the stop location 304, is calculated as VS=TS/VT. The test vector causing the failure, or VF, is determined as the total number of test vectors TV minus the VS, or VF=TV−VS. As an example, if the pixel shift PS is measured at approximately 83 pixels and the pixel rate is approximately 806 ns per pixel, then the time shift TS is calculated as TS=PS*PR=83 pixels*806 ns/pixel which is approximately 66.9 microseconds (μs) from the P/F modulation location 204 to the stop location 304. If the time per vector VT is approximately 0.05 μs per vector, then the vector shift VS is calculated as VS=TS/VT=66.9/0.05 which is approximately 1338 test vectors. If the total number of test vectors is 4,690 then the test vector VF (or test vector number) causing the P/F modulation indication is determined as VF=4,690−1338=3,352.

Functional testing using TRLEM probing is initiated within a timing window or probe window which is centered at VF in order to probe the P/F modulation location 204 for functional analysis. The pixel shift PS and the scan rate information may both be estimated based on test data. In one embodiment, for example, the image scan, the spatially resolved laser assisted circuit testing (e.g., LADA) and the asynchronous laser scan test procedure are all superimposed upon each other and examined by a test engineer to estimate the pixel shift PS. The measured information provides a relatively accurate determination of VF, or the vector causing the failure at the P/F modulation location 204, for the initial TRLEM probe window. The determination of VF as described herein significantly reduces the functional analysis time used to determine the cause of the failure. For example, the functional test time is reduced from a matter of more than week or several weeks to only a day or two (or less). In the example above for PS is approximately 83 pixels with a pixel rate of approximately 806 ns per pixel and a time per vector VT of approximately 0.05 μs per vector, the TRLEM probe window is set to correspond with test vector number 3,352 at the P/F modulation location 204. The probing window may be adjusted around this vector until the test conditions causing the P/F modulation are determined.

Figure 4:
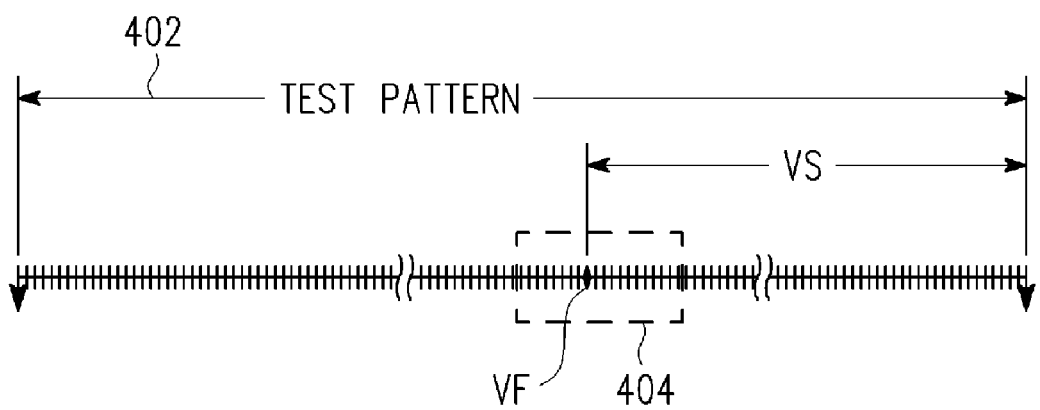
FIG. 4 is a diagram illustrating the test pattern with a TRLEM probe window centered or otherwise incorporating the test vector VF determined (or estimated) to be the cause of the failure of the DUT at the pass-fail modulation location illustrated in FIG. 2.

FIG. 4 is a diagram illustrating an exemplary test pattern 402 with a TRLEM probe window 404 centered or otherwise incorporating the test vector VF determined (or estimated) to be the cause of the failure of the DUT 102 at the P/F modulation location 204. The test pattern 402 is illustrated as a series of sequential, evenly-spaced hash marks in which each hash mark denotes the end of one test vector and the beginning of the next such that the distance between each hash mark represents approximate duration of a corresponding test vector in the overall test pattern. As understood by those skilled in the art, each test vector is applied to the DUT 102 for each cycle of a test clock, such as a 20 megahertz (MHz) test clock or the like. The TRLEM probe window 404 is used as the initial probe window for purposes of TRLEM functional probing. During TRLEM functional probing, the test pattern 402 is repeatedly applied to the DUT 102 and the test vectors within the TRLEM probe window 404 are isolated and examined during functional probing. The probe window may be adjusted earlier or later in the test pattern 402 depending upon functional probing results. The size of the TRLEM probe window 404 may be adjusted as desired. In one embodiment, for example, the initial TRLEM probe window 404 may include about 20 test vectors, although any suitable probe window size (smaller or larger than 20 test vectors) may be used depending upon the applicable test procedures. In one embodiment based on practical limitations of the TRLEM equipment, there is a trade-off between probe window length and time resolution in which a window of 10 μs is considered a relatively long window duration.

Figure 5:
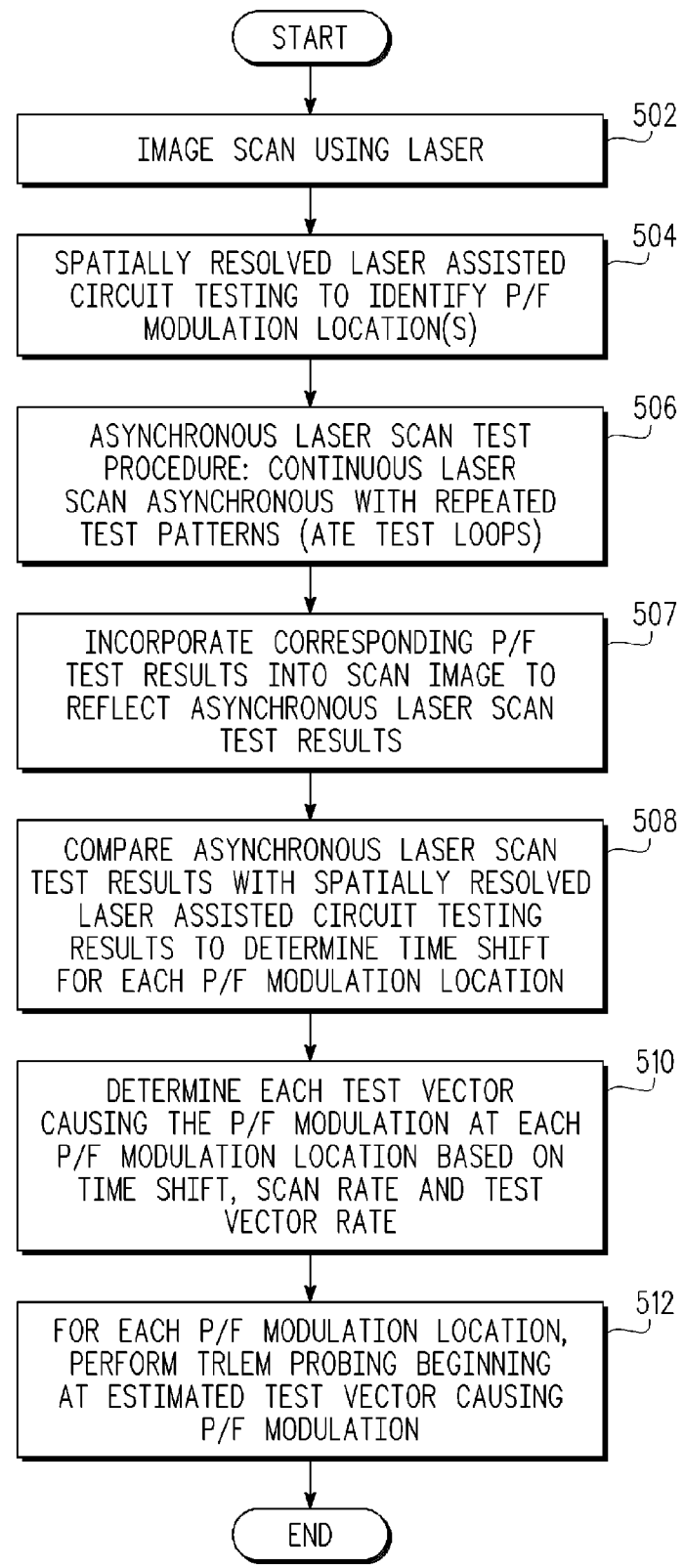
FIG. 5 is a flowchart diagram illustrating operation of the TRRADA test procedure performed by the TRLADA test system of FIG. 1 according to one embodiment for testing the DUT.

FIG. 5 is a flowchart diagram illustrating operation of the TRRADA test procedure 116 performed by the TRLADA test system 100 according to one embodiment for testing the DUT 102. At a first block 502, the laser control unit 108 causes the LSM 104 to perform an image scan of the area of interest of the DUT 102 with the laser beam 110 at an appropriate imaging power level for capturing a reflected image. At next block 504, the LSM 104 and the ATE 106 perform spatially resolved laser assisted circuit testing (e.g., LADA) to identify any P/F modulation locations, including, for example, the P/F modulation location 204. It is noted that multiple P/F modulation locations may be identified. At next block 506, the LSM 104 and the ATE 106 are controlled according to the TRRADA test procedure 116 to perform an asynchronous laser scan test procedure in which the laser beam 110 continuously scans the DUT 102 at a selected scan rate while the test pattern 402 is repeatedly applied to the DUT 102 in an asynchronous manner. The test pattern 402 is executed asynchronously with the laser scan resulting in the mapping of particular vector(s) to a location within the area of interest along the semiconductor die when the laser scans that position. Also, the length of the test pattern scans (or speed of laser scanning) may be adjusted to achieve quicker and more accurate results. P/F modulation indications are provided which are shifted in time relative to corresponding P/F modulation locations previously determined by spatially resolved laser assisted circuit testing. In one embodiment, the asynchronous laser scan test procedure may be performed within the entire area of interest or within a smaller scan window 210. As previously noted, the asynchronous laser scan test procedure extracts timing information from the laser scan test in which test results are shifted in time relative to the P/F modulation locations.

At next block 507, corresponding P/F test results indicated by the P/F signal are incorporated (e.g., averaged) into scanned images reflecting the asynchronous laser scan test procedure results. As previously described, for example, each test result indicated by the P/F signal is converted to an image value which is combined with corresponding test values at corresponding image locations for storage or display of test results. At next block 508, the spatially resolved laser assisted circuit testing results are compared with the asynchronous laser scan test procedure results to determine a time shift relative to each P/F modulation location. As previously discussed, the time shift may be provided as a pixel shift on an image, where the pixel shift is converted to a corresponding time shift based on scan and test vector rates. Alternatively, the time shift may be measured directly by the oscilloscope 120 or similar time-based equipment. At next block 510, the test vector causing the P/F modulation at each P/F modulation location is calculated using the time shift and the test vector rate as previously described. At next block 512, TRLEM probing is conducted for each (or selected) P/F modulation location(s) using probe windows centered around the identified test vector causing the P/F modulation indication. As previously noted, the pixel shift information is measured so that the identified test vector is an estimate of the exact timing of the P/F modulation. Nonetheless, the P/F modulation vector measurement is sufficiently accurate to initiate TRLEM probing so that the analysis time to identify the cause of the P/F modulation is substantially reduced as compared to conventional techniques.

Referring to FIGS. 1 and 5, it is appreciated by one of ordinary skill in the art that the TRLADA test system 100 is similar to a test system for performing spatially resolved laser assisted circuit testing except that the test procedure is modified according to the TRRADA test procedure 116 as described herein. In particular, the TRRADA test procedure 116 incorporates the asynchronous laser scan test procedure (block 506) in which the laser beam 110 is scanned across the DUT 102 at a selected scan rate to incorporate temporal information with the spatial information. The LSM 104 and ATE 106 may remain substantially unmodified. The LSM 104 may be a CW type scanning laser microscope and there is no need for expensive pulse-type laser systems. The results of the asynchronous laser scan test procedure are compared with the results of the spatially resolved laser assisted circuit testing (block 508) to determine pixel shift information at each P/F modulation location. The pixel shift information and the known spatial information are used to determine the test vector causing P/F modulation at each P/F modulation location (block 510). The identified test vector information enables more accurate identification of a TRLEM probe window (block 512) for identifying the cause of P/F modulation.

Figure 6:
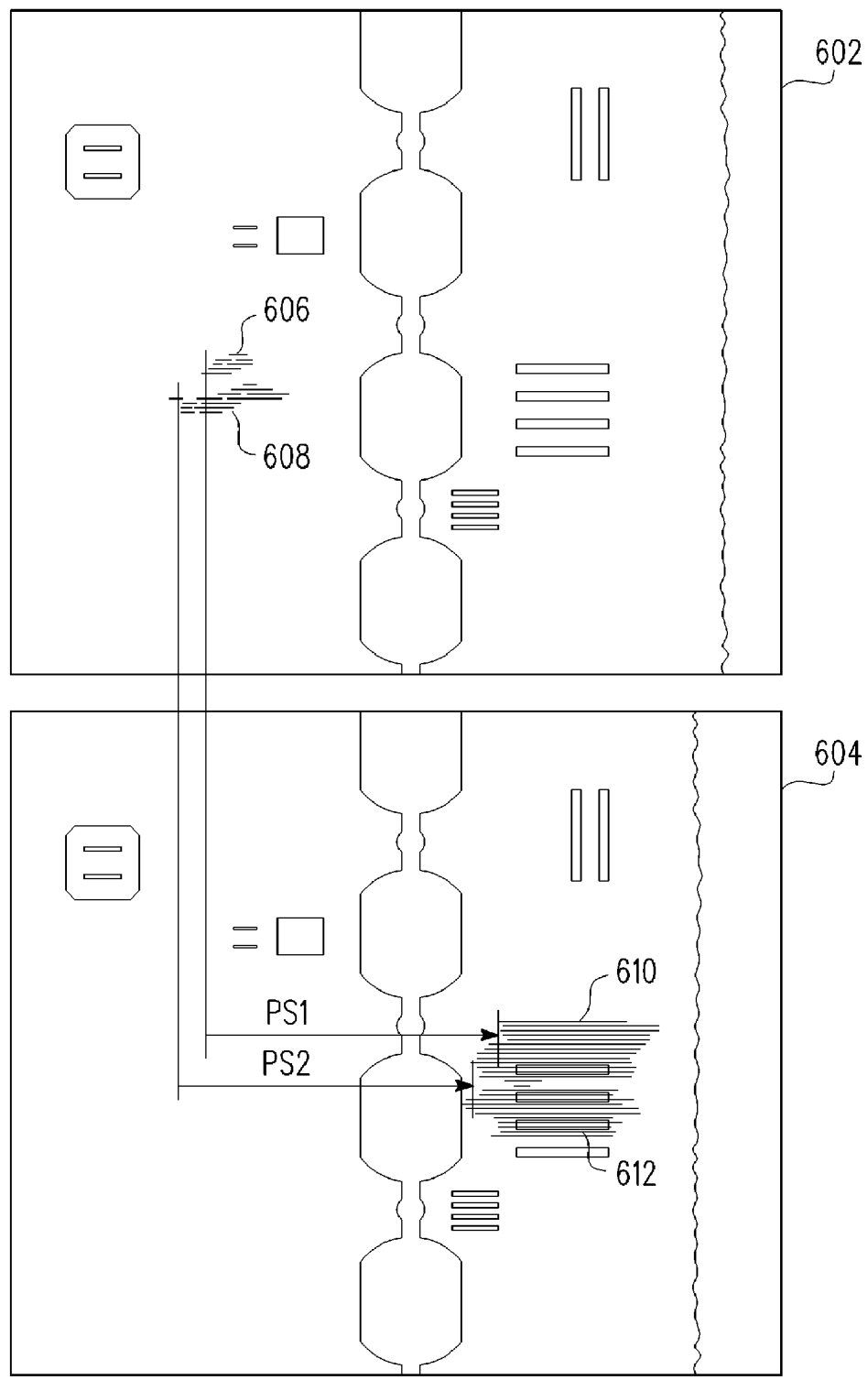
FIG. 6 is an image diagram illustrating results of an exemplary TRRADA test procedure performed on a semiconductor device according to one embodiment.

FIG. 6 is an image diagram illustrating results of an exemplary TRRADA test procedure 116 performed on a semiconductor device according to one embodiment. The results are shown as two scanned images 602 and 604 representing a scanned image of the circuitry of the device with a laser at an appropriate imaging power level such as performed at block 502 of FIG. 5 previously described. The first image 602 illustrates results of spatially resolved laser assisted circuit testing (e.g., LADA) such as described at block 504 in which two P/F modulation locations 606 and 608 are each shown as a cluster of pixel graphics superimposed on the background image. The second image 604 illustrates results of an asynchronous laser scan test as described at block 506 in which a pair of shifted P/F modulation indications 610 and 612 are each shown as a cluster of shifted pixel graphics superimposed on the background image. The results are compared by measuring the relative offset between the P/F modulation locations 606 and 608 and the corresponding shifted P/F modulation indications 610 and 612, respectively. The P/F modulation location 606 corresponds with the shifted P/F modulation indication 610 and the P/F modulation location 608 corresponds with the shifted P/F modulation indication 612. As shown, a pixel shift PS1 is measured as an offset between P/F modulation location 606 and P/F modulation indication 610 and a pixel shift PS2 is measured as an offset between P/F modulation location 608 and P/F modulation indication 612. The pixel shift information is used to derive the corresponding vector shift information and thus to identify one or more test vectors within the corresponding test pattern causing the P/F modulation at each P/F modulation location as described herein.

A method of time resolved radiation assisted device alteration testing of a semiconductor circuit according to one embodiment includes performing spatially resolved radiation assisted circuit testing on the semiconductor circuit while applying a test pattern including multiple test vectors to determine a pass-fail modulation location on the semiconductor circuit, asynchronously scanning the semiconductor circuit with radiation while repeatedly applying the test pattern and providing pass-fail results, combining corresponding pass-fail results provided during the asynchronously scanning the semiconductor circuit to determine a shifted pass-fail modulation indication, determining time shift information between the pass-fail modulation location and the shifted pass-fail modulation indication, and identifying at least one of the test vectors based on the time shift information.

The method may include averaging corresponding pass-fail values indicated by a pass-fail signal. The method may include asynchronously scanning the semiconductor circuit with a continuous wave laser. The method may include asynchronously scanning at a selected scan rate which is based on a number of test vectors of the test pattern and a test vector rate. The method may include measuring an offset between the pass-fail modulation location and the shifted pass-fail modulation indication, and converting the offset to the time shift information based on scanning rate. The method may include scanning an image of the semiconductor circuit to provide a scanned image, modifying the scanned image to identify the pass-fail modulation location, modifying the scanned image to identify the shifted pass-fail modulation indication, and measuring a pixel shift on the scanned image. The method may include determining a vector shift based on the time shift information and a test vector rate of the test pattern, and subtracting the vector shift from a total number of test vectors of the test pattern. The method may include synchronizing an oscilloscope with asynchronously scanning the semiconductor circuit, and averaging pass-fail values to display the time shift information on the oscilloscope. The spatially resolved radiation assisted circuit testing may be laser assisted device alteration testing.

A method of time resolved laser assisted device alteration testing of a semiconductor circuit according to another embodiment includes performing laser assisted device alteration testing on a selected area of the semiconductor circuit using a test pattern to provide a pass-fail modulation location on the semiconductor circuit, scanning at least a portion of the selected area of the semiconductor circuit which includes pass-fail modulation location multiple times with a laser beam while repeatedly applying the test pattern asynchronous with respect to laser beam scanning and providing corresponding pass-fail results for each application of the test pattern, averaging corresponding ones of the pass-fail results for providing a shifted pass-fail modulation indication, determining shift information between the pass-fail modulation location and the shifted pass-fail modulation indication, and identifying a test vector of the test pattern based on the time shift information.

The method may include scanning an image of the selected area portion, overlaying a first graphic on the scanned image representing the pass-fail modulation location, overlaying a second graphic on the scanned image representing the shifted pass-fail modulation indication, and displaying the scanned image with the first and second graphics. The method may include measuring a pixel shift between the first and second graphics on the scanned image.

A time resolved radiation assisted device alteration test system for testing circuitry of a semiconductor device includes a radiation scanning system, test equipment, and a control system. The radiation scanning system scans the semiconductor device with radiation. The test equipment applies a test pattern including multiple test vectors to the semiconductor device and provides test results according to a time resolved radiation assisted device alteration test procedure. The control system controls the radiation scanning system while receiving the test results according to the time resolved radiation assisted device alteration test procedure to enable determination of time shift information between a pass-fail modulation location and a shifted pass-fail modulation indication. The time resolved radiation assisted device alteration test procedure causes the radiation scanning system and the test equipment to perform spatially resolved radiation assisted circuit testing of the semiconductor device to identify the pass-fail modulation location, and to perform asynchronous radiation scan testing in which the test equipment repeatedly applies the test pattern to the semiconductor device while providing the test results and while the radiation scanning system asynchronously scans the semiconductor device with radiation to provide the shifted pass-fail modulation indication.

The radiation scanning system may be implemented as a laser scanning microscope which provides a continuous wave laser beam. In one embodiment, the test equipment provides a pass-fail signal indicating the test results, where the control system causes the radiation scanning system to scan the semiconductor device to provide a scanned image, and where the control system is configured to convert the pass-fail signal into test result values incorporated into the scanned image. The control system may further incorporate a first graphic indicating the pass-fail modulation location and a second graphic indicating the shifted pass-fail modulation indication into the scanned image. The test system may further include a display device in which the control system displays the scanned image on the display device. In one embodiment the control system averages corresponding test results during the asynchronous radiation scan testing into a scan image. In one embodiment, the time resolved laser assisted device alteration test procedure causes the radiation scanning system to scan a reduced-size image incorporating the pass-fail modulation location of the semiconductor device for performing the asynchronous radiation scan testing.

In another embodiment, an oscilloscope is provided which is synchronized with the radiation scanning system and which receives the test results. The oscilloscope averages corresponding test results of the asynchronous radiation scan testing and displays the time shift information.

Although the present invention has been described in considerable detail with reference to certain preferred versions thereof, other versions and variations are possible and contemplated. For example, circuits or logic blocks described herein may be implemented as discrete circuitry or integrated circuitry or software or any alternative configurations. Those skilled in the art should appreciate that they can readily use the disclosed conception and specific embodiments as a basis for designing or modifying other structures for carrying out the same purposes of the present invention without departing from the spirit and scope of the invention as defined by the appended claims.

The invention claimed is:

1. A method of time resolved radiation assisted device alteration testing of a semiconductor circuit, comprising:
    performing spatially resolved radiation assisted circuit testing on the semiconductor circuit while applying a test pattern comprising a plurality of test vectors to determine a pass-fail modulation location on the semiconductor circuit;
    asynchronously scanning the semiconductor circuit with radiation while repeatedly applying the test pattern and providing pass-fail results;
    combining corresponding pass-fail results provided during said asynchronously scanning the semiconductor circuit to determine a shifted pass-fail modulation indication;
    determining time shift information between the pass-fail modulation location and the shifted pass-fail modulation indication; and
    identifying at least one of said plurality of test vectors based on the time shift information.

2. The method of claim 1, wherein said combining corresponding pass-fail information comprises averaging corresponding pass-fail values indicated by a pass-fail signal.

3. The method of claim 1, wherein said asynchronously scanning the semiconductor circuit with radiation comprises scanning the semiconductor circuit with a continuous wave laser.

4. The method of claim 1, wherein said asynchronously scanning the semiconductor circuit with radiation comprises scanning at a selected scan rate which is based on a number of said plurality of test vectors of the test pattern and a test vector rate.

5. The method of claim 1, wherein said determining time shift information comprises:
    measuring an offset between the pass-fail modulation location and the shifted pass-fail modulation indication; and
    converting the offset to the time shift information based on scanning rate.

6. The method of claim 5, further comprising:
    scanning an image of the semiconductor circuit to provide a scanned image;
    modifying the scanned image to identify the pass-fail modulation location;
    modifying the scanned image to identify the shifted pass-fail modulation indication; and
    wherein said measuring an offset comprises measuring a pixel shift on the scanned image.

7. The method of claim 1, wherein said identifying at least one of the plurality of test vectors comprises:
    determining a vector shift based on the time shift information and a test vector rate of the test pattern; and
    subtracting the vector shift from a total number of test vectors of the test pattern.

8. The method of claim 1, further comprising:
    synchronizing an oscilloscope with said asynchronously scanning the semiconductor circuit; and
    wherein said combining the pass-fail information comprises averaging pass-fail values to display the time shift information on the oscilloscope.

9. The method of claim 1, wherein said performing spatially resolved radiation assisted circuit testing comprises laser assisted device alteration testing.

10. A method of time resolved laser assisted device alteration testing of a semiconductor circuit, comprising:
    performing laser assisted device alteration testing on a selected area of the semiconductor circuit using a test pattern comprising a plurality of test vectors to provide a pass-fail modulation location on the semiconductor circuit;
    scanning at least a portion of the selected area of the semiconductor circuit which includes pass-fail modulation location a plurality of times with a laser beam while repeatedly applying the test pattern asynchronous with respect to laser beam scanning and providing a corresponding one of a plurality of pass-fail results for each application of the test pattern;
    averaging corresponding ones of said plurality of pass-fail results for providing a shifted pass-fail modulation indication;
    determining shift information between the pass-fail modulation location and the shifted pass-fail modulation indication; and
    identifying at least one of said plurality of test vectors based on the time shift information.

11. The method of claim 10, further comprising scanning an image of the selected area portion, overlaying a first graphic on the scanned image representing the pass-fail modulation location, overlaying a second graphic on the scanned image representing the shifted pass-fail modulation indication, and displaying the scanned image with the first and second graphics.

12. The method of claim 11, wherein said determining shift information comprises measuring a pixel shift between the first and second graphics on the scanned image.

13. A time resolved radiation assisted device alteration test system for testing circuitry of a semiconductor device, comprising:
    a radiation scanning system for scanning the semiconductor device with radiation;
    test equipment for applying a test pattern comprising a plurality of test vectors to the semiconductor device and for providing test results according to a time resolved radiation assisted device alteration test procedure;
    a control system which controls said radiation scanning system while receiving said test results according to said time resolved radiation assisted device alteration test procedure to enable determination of time shift information between a pass-fail modulation location and a shifted pass-fail modulation indication; and
    wherein said time resolved radiation assisted device alteration test procedure causes said radiation scanning system and said test equipment to perform spatially resolved radiation assisted circuit testing of the semiconductor device to identify said pass-fail modulation location, and to perform asynchronous radiation scan testing in which said test equipment repeatedly applies said test pattern to the semiconductor device while providing said test results and while said radiation scanning system asynchronously scans the semiconductor device with radiation to provide said shifted pass-fail modulation indication.

14. The time resolved radiation assisted device alteration test system of claim 13, wherein said radiation scanning system comprises a laser scanning microscope which provides a continuous wave laser beam.

15. The time resolved radiation assisted device alteration test system of claim 13, wherein said test equipment provides a pass-fail signal indicating said test results, wherein said control system causes said radiation scanning system to scan the semiconductor device to provide a scanned image, and wherein said control system is configured to convert said pass-fail signal into test result values incorporated into said scanned image.

16. The time resolved radiation assisted device alteration test system of claim 15, wherein said control system incorporates a first graphic indicating said pass-fail modulation location and a second graphic indicating said shifted pass-fail modulation indication into said scanned image.

17. The time resolved radiation assisted device alteration test system of claim 16, further comprising a display device, wherein said control system displays said scanned image on said display device.

18. The time resolved radiation assisted device alteration test system of claim 13, wherein said control system averages corresponding test results during said asynchronous radiation scan testing into a scan image.

19. The time resolved radiation assisted device alteration test system of claim 13, further comprising an oscilloscope which is synchronized with said radiation scanning system and which receives said test results, wherein said oscilloscope averages corresponding test results of said asynchronous radiation scan testing and displays said time shift information.

20. The time resolved radiation assisted device alteration test system of claim 13, wherein said time resolved laser assisted device alteration test procedure causes said radiation scanning system to scan a reduced-size image incorporating said pass-fail modulation location of the semiconductor device for performing said asynchronous radiation scan testing.

* * * * *